(12) United States Patent
Luckner et al.

(10) Patent No.: US 11,915,953 B2
(45) Date of Patent: Feb. 27, 2024

(54) APPARATUS, SYSTEMS, AND METHODS OF MEASURING EDGE RING DISTANCE FOR THERMAL PROCESSING CHAMBERS

(71) Applicant: Applied Materials, Inc., Santa Clara, CA (US)

(72) Inventors: Ole Luckner, Dresden (DE); Wolfgang R. Aderhold, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 715 days.

(21) Appl. No.: 16/852,154

(22) Filed: Apr. 17, 2020

(65) Prior Publication Data

US 2021/0327732 A1 Oct. 21, 2021

(51) Int. Cl.
| | |
|---|---|
| *H01L 21/67* | (2006.01) |
| *H01L 21/687* | (2006.01) |
| *G01J 5/02* | (2022.01) |
| *H05B 3/00* | (2006.01) |
| *G01B 11/02* | (2006.01) |

(52) U.S. Cl.
CPC ...... *H01L 21/67259* (2013.01); *G01B 11/026* (2013.01); *G01J 5/02* (2013.01); *H01L 21/67115* (2013.01); *H01L 21/67248* (2013.01); *H01L 21/68721* (2013.01); *H05B 3/0047* (2013.01)

(58) Field of Classification Search
CPC ......... H01L 21/67259; H01L 21/67248; H01L 21/67115; H01L 21/68721; H05B 3/0047; G01B 11/026; G01J 5/02
USPC ....................................................... 392/416
See application file for complete search history.

(56) References Cited

U.S. PATENT DOCUMENTS

| | | | |
|---|---|---|---|
| 5,350,899 | A | 9/1994 | Ishikawa et al. |
| 7,704,327 | B2 | 4/2010 | Waldhauer et al. |
| 9,245,768 | B2 | 1/2016 | Aderhold |
| 9,786,529 | B2 | 10/2017 | Ranish et al. |
| 2003/0186554 | A1 | 10/2003 | Tam et al. |
| 2003/0186563 | A1* | 10/2003 | Kobayashi ............ H01L 21/324 438/795 |
| 2008/0090309 | A1 | 4/2008 | Ranish et al. |
| 2010/0264132 | A1* | 10/2010 | Koelmel ................. H01L 21/68 356/621 |
| 2011/0020957 | A1 | 1/2011 | Angellier et al. |
| 2013/0206362 | A1 | 8/2013 | Li et al. |
| 2013/0287536 | A1* | 10/2013 | Koelmel ............... H01L 21/681 414/754 |
| 2015/0050118 | A1* | 2/2015 | Sorabji ................. H01L 21/324 414/806 |
| 2018/0061696 | A1* | 3/2018 | D'Ambra ............... G01N 21/64 |

(Continued)

FOREIGN PATENT DOCUMENTS

| | | |
|---|---|---|
| EP | 1933368 A2 | 6/2008 |
| JP | H10223732 A | 8/1998 |
| JP | 2004031396 A | 1/2004 |

OTHER PUBLICATIONS

International Search Report and Written Opinion dated Jun. 17, 2021 for Application No. PCT/US2021/019532.

*Primary Examiner* — Charlee J. C. Bennett
(74) *Attorney, Agent, or Firm* — Patterson + Sheridan, LLP

(57) ABSTRACT

Aspects of the present disclosure relate to apparatus, systems, and methods of measuring edge ring distance for thermal processing chambers. In one example, the distance measured is used to determine a center position shift of the edge ring.

17 Claims, 6 Drawing Sheets

(56) References Cited

U.S. PATENT DOCUMENTS

| | | | |
|---|---|---|---|
| 2018/0301322 A1* | 10/2018 | Sugita | H01J 37/32642 |
| 2020/0194296 A1* | 6/2020 | Numakura | H01L 21/6831 |
| 2021/0358790 A1* | 11/2021 | Ganguli | H01L 21/681 |

* cited by examiner

US 11,915,953 B2

APPARATUS, SYSTEMS, AND METHODS OF MEASURING EDGE RING DISTANCE FOR THERMAL PROCESSING CHAMBERS

BACKGROUND

Field

Aspects of the present disclosure relate to apparatus, systems, and methods of measuring edge ring distance for thermal processing chambers. In one example, the distance measured is used to determine a center position shift of the edge ring.

Description of the Related Art

During rapid thermal annealing of substrates, components that support the edge undergo thermal expansions and contractions, which can cause changes in the positions of such components. Changes in the positions of such components can cause non-uniformity in the temperatures of substrates, which can cause non-uniformities in material on substrates during thermal processing.

Therefore, there is a need for apparatus, systems, and methods that facilitate temperature uniformity and material uniformity during thermal processing in a manner that facilitates accuracy, effectiveness, and time savings.

SUMMARY

Aspects of the present disclosure relate to apparatus, systems, and methods of measuring edge ring distance for thermal processing chambers. In one example, the distance measured is used to determine a center position shift of the edge ring.

In one implementation, a thermal processing chamber apparatus includes a chamber body including one or more sidewalls and a processing volume. The thermal processing chamber apparatus also includes a rotor disposed in the processing volume of the chamber body. The thermal processing chamber apparatus also includes an edge ring supported on the rotor. The edge ring includes an inner surface and an outer surface. The thermal processing chamber apparatus also includes a plurality of heat lamps positioned above the edge ring and above the rotor. The thermal processing chamber apparatus also includes one or more distance sensors mounted to the one or more sidewalls of the chamber body. Each distance sensor is directed toward the outer surface of the edge ring to measure a distance between the outer surface of the edge ring and the respective distance sensor.

In one implementation, a non-transitory computer-readable medium includes instructions that, when executed, cause a thermal processing chamber system to heat a first substrate disposed on an edge ring in a processing volume of a chamber body to a first temperature using a plurality of heat lamps. The instructions also cause the thermal processing chamber system to cool the first substrate to a second temperature that is lesser than the first temperature, and measure a distance between a distance sensor and an outer surface of the edge ring. The instructions also cause the thermal processing chamber system to determine a center position shift of the edge ring using the distance, and determine a corrected landing position using the center position shift. The instructions also cause the thermal processing chamber system to instruct a robot to align a second substrate with the corrected landing position.

In one implementation, a non-transitory computer-readable medium includes instructions that, when executed, cause a thermal processing chamber system to heat a first substrate disposed on an edge ring in a processing volume of a chamber body to a first temperature using a plurality of heat lamps. The instructions also cause the thermal processing chamber system to cool the first substrate to a second temperature that is lesser than the first temperature, and rotate the edge ring using a rotor. The edge ring is supported on the rotor. The instructions also cause the thermal processing chamber system to measure a distance between a distance sensor and an outer surface of the edge ring while the edge ring rotates. The instructions also cause the thermal processing chamber system to determine a center position shift of the edge ring using the distance, and determine a corrected landing position using the center position shift.

BRIEF DESCRIPTION OF THE DRAWINGS

So that the manner in which the above-recited features of the disclosure can be understood in detail, a more particular description of the disclosure, briefly summarized above, may be had by reference to implementations, some of which are illustrated in the appended drawings. It is to be noted, however, that the appended drawings illustrate only common implementations of this disclosure and are therefore not to be considered limiting of its scope, for the disclosure may admit to other equally effective implementations.

Figure 1A:
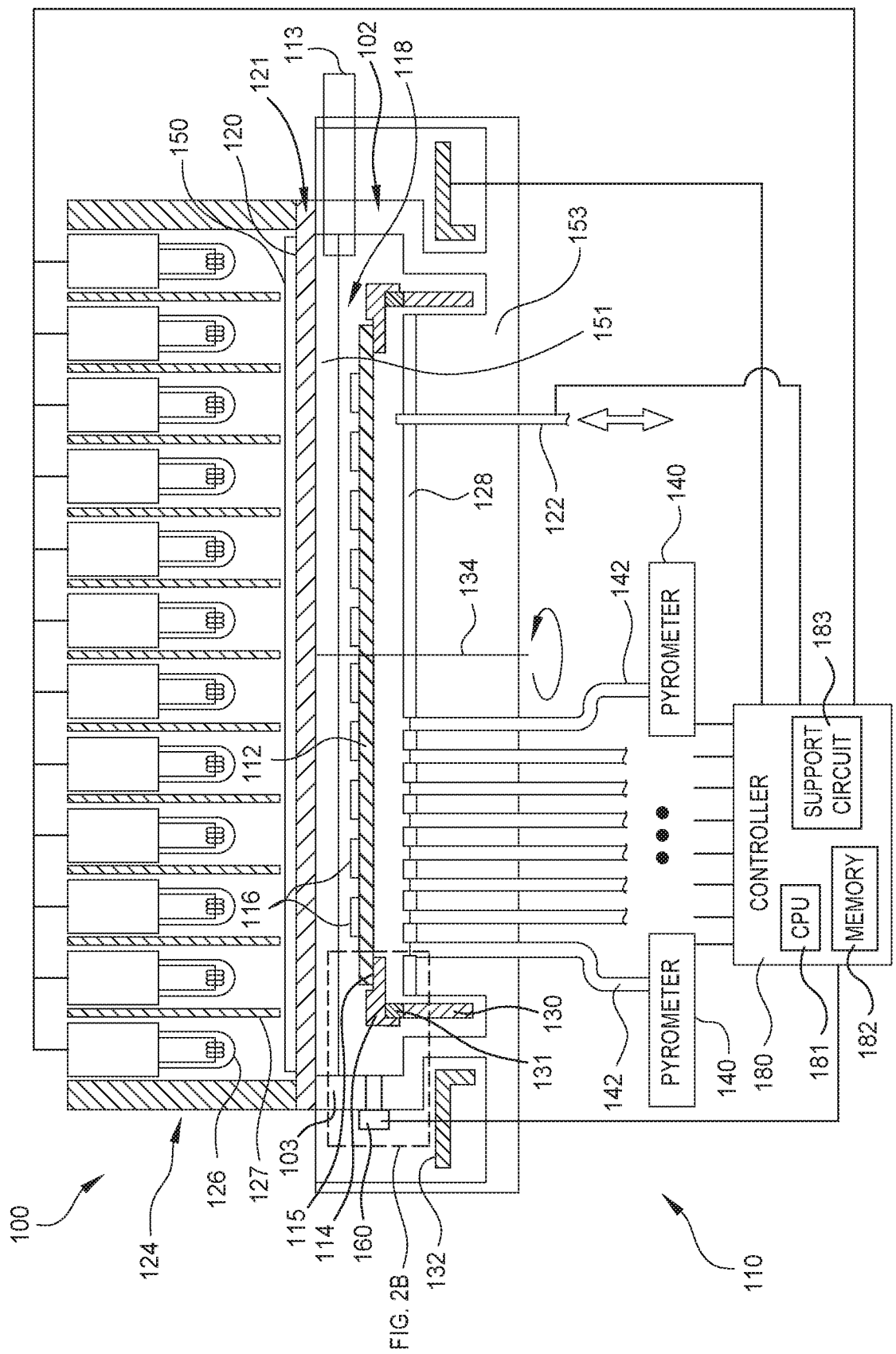
FIG. 1A is a partial schematic cross-sectional view of a thermal processing chamber, according to one implementation.

To facilitate understanding, identical reference numerals have been used, where possible, to designate identical elements that are common to the figures. It is contemplated that elements disclosed in one implementation may be beneficially utilized on other implementations without specific recitation.

DETAILED DESCRIPTION

Aspects of the present disclosure relate to apparatus, systems, and methods of measuring edge ring distance for thermal processing chambers. In one example, the distance measured is used to determine a center position shift of the edge ring.

FIG. 1A is a partial schematic cross-sectional view of a thermal processing chamber 100, according to one implementation. The thermal processing chamber 100 is a rapid thermal processing chamber. The thermal processing chamber 100 is a part of a thermal processing chamber system 110.

A substrate 112 to be processed in the thermal processing chamber 100 is provided through the valve (such as a slit valve) or access port 113 into the processing volume 118 of the thermal processing chamber 100. The substrate 112 is supported on a periphery thereof by an annular edge ring 114. The edge ring 114 has an annular sloping shelf 115 contacting the corner of the substrate 112. The substrate 112 is oriented such that processed features 116 already formed on a top surface of the substrate 112 face upwardly toward a radiant heating apparatus 124.

The thermal processing chamber 100 includes a chamber body 102 and a processing volume 118 disposed within the chamber body 102. The chamber body 102 includes one or more sidewalls 103. The processing volume 118 is defined on an upper side thereof by a transparent quartz window 120. Although shown for schematic illustration, the features 116 on the substrate 112 do not generally project substantial distances beyond the surface of the substrate 112 but constitute patterning within and near the plane of the surface of the substrate 112.

The thermal processing chamber 100 processes the substrate 112, such as by using rapid thermal annealing, to oxidize the substrate and/or to activate a species (such as a dopant) implanted on the substrate 112.

Three lift pins 122 are raised and lowered to engage and support a bottom surface (such as a backside surface) of the substrate 112 when the substrate 112 is handled between a substrate transfer apparatus, such as a robot. The present disclosure contemplates that the robot apparatus 400 described in relation to FIG. 4 may be used. A robot blade of the robot and/or a robot arm of the robot extends through the valve or access port 113 to provide the substrate 112 into the thermal processing chamber 100 and onto the edge ring 114. In order to heat the substrate 112 in the processing volume 118, the radiant heating apparatus 124 is positioned above the window 120 to direct radiant energy toward the substrate 112. In the thermal processing chamber 100, the radiant heating apparatus includes a plurality of heat lamps 126 positioned in respective reflective tubes 127 arranged in a hexagonal close-packed array above the window 120. The plurality of heat lamps 126 include high-intensity tungsten-halogen lamps. The plurality of heat lamps 126 are positioned above the edge ring 114.

The array of heat lamps 126 may be referred to as the lamphead. However, other radiant heating apparatuses may be substituted to provide radiant heat energy to the thermal processing chamber 100. The heat lamps 126 involve resistive heating to quickly elevate, or ramp up, the temperature of the radiant source to ramp the temperatures of the processing volume 118 and the substrate 112. Heat lamps 126 may include incandescent and tungsten halogen incandescent lamps having an envelope of glass or silica surrounding a filament and flash lamps which include an envelope of glass or silica surrounding a gas, such as xenon. Heat lamps 126 may include arc lamps that include an envelope of glass, ceramic, or silica that surrounds a gas or vapor. Such lamps provide radiant heat when the gas is energized. As provided herein, the term lamp is intended to include lamps having an envelope that surrounds a heat source. The "heat source" of a lamp refers to a material or element that can increase the temperature of the substrate, for example, a filament or gas than may be energized. Additionally or alternatively, it is contemplated that laser sources may be utilized to elevate the temperature of the substrate 112.

As provided herein, rapid thermal processing (RTP) refers to a process capable of uniformly heating a substrate at rates of about 10 degrees Celsius per second and higher, for example at rates of about 10 degrees per second to about 250 degrees per second. Ramp-down (cooling) rates in the RTP chamber are in a range of about 80 degrees Celsius per second to about 150 degrees Celsius per second. Aspects of the present disclosure may also be applied to flash annealing, such as annealing a substrate in under 5 seconds, such as less than 1 second, or in a plurality of milliseconds.

A passive manner of improving the efficiency of heating includes a reflector 128 extending parallel to and over an area greater than the substrate 112 and facing the bottom surface of the substrate 112. The reflector 128 efficiently reflects heat radiation emitted from the substrate 112 back to the substrate 112. The spacing between the substrate 112 and the reflector 128 may be within the range of about 3 mm to about 9 mm, and the aspect ratio of the width to the thickness of the cavity is greater than about 20 mm. In one embodiment, which can be combined with other embodiments, a reflector plate is included to enhance the apparent emissivity of the substrate 112. The reflector 128, which may have a gold coating or multilayer dielectric interference mirror, effectively forms a black-body cavity at the back of the substrate 112 that functions to distribute heat from warmer portions of the substrate 112 to cooler portions. The black-body cavity is filled with a radiation distribution, usually described in terms of a Planck distribution, corresponding to the temperature of the substrate 112 while the radiation from the heat lamps 126 has a distribution corresponding to the much higher temperatures associated with the heat lamps 126.

The chamber body 102 includes an upper wall 121 and a lower wall 153. The reflector 128 is disposed on a water-cooled base formed in the lower wall 153 made of a material, such as a metal, chosen for its ability to heat sink excess radiation from the substrate 112, such as during cool down. The upper wall 121 includes the quartz window 120 and a lower wall 153 is substantially parallel to the upper wall 121. The lower wall 153 may be made of a material that is significantly non-transparent, such as a metal.

The edge ring 114 is disposed on and supported on a support cylinder 131, and is movable relative to the support cylinder 131 and a rotor 130 upon thermal expansion and/or retraction of the edge ring 114. The edge ring 114 may also be moved using the support cylinder 131 and the rotor 130. The support cylinder 131 may include a thermal insulation material. The support cylinder 131 is supported on, and may be coupled to or formed as part of, the rotor 130. The rotor 130 and the support cylinder 131 are rotatable. The rotor 130 is cylindrical. The rotor 130 is magnetically levitated in the chamber body 102. The rotor 130 is magnetically coupled to a drive ring 132 positioned outside of the one or more sidewalls 103 of the chamber body 102. Gravitational forces and a lower shoulder extending downward from the lower surface 166 of the edge ring 115 (shown in FIG. 1B) facilitate retaining the edge ring 114 on the support cylinder 131 and the rotor 130.

In one embodiment, which can be combined with other embodiments, the drive ring 132 is a rotatable flange and is magnetically coupled to the rotor 130 such that the rotor 130 rotates with rotation of the drive ring 132. In such an embodiment, a motor rotates the drive ring 132 to rotate the rotor 130. In one embodiment, which can be combined with other embodiments, the drive ring 132 is fixed relative to the chamber body 102 and includes electrical coils that, when powered, generate magnetic forces to magnetically rotate and/or levitate the rotor 130. When the rotor 130 rotates, the edge ring 114 and the substrate 112 supported on the edge ring 114 rotate about a center axis 134 of the substrate 112. In the implementation shown, the center axis 134 is aligned with a center axis of the edge ring 114.

The heat lamps 126 may be divided into heating zones arranged in a generally ring-like formation about the center axis 134. Control circuitry varies the voltage delivered to the heat lamps 126 in the different zones to thereby tailor the radial distribution of radiant energy. One or more pyrometers 140 are coupled through one or more optical light pipes 142 positioned to face the bottom surface of the substrate 112 through apertures in the reflector 128. The one or more pyrometers 140 measure the temperature across a radius of the stationary or rotating substrate 112. The light pipes 142 may be formed of various structures including sapphire, metal, and silica fiber. The pyrometers 140 are disposed below the edge ring 114, and the edge ring 114 is disposed between the pyrometers 140 and the plurality of heat lamps 126.

In one embodiment, which can be combined with other embodiments, a film of reflective coating 150 may be disposed on the side of the window 120 facing the heat lamps 126. In one embodiment, which can be combined with other embodiments, a reflective coating 151 is disposed on the side of the window 120 facing the substrate 112. In the implementation shown in FIG. 1, a reflective coating 150 and 151 is disposed on both sides of the window 120. The reflective coating 150 and 151 facilitates blocking radiation in the pyrometer bandwidth from propagating through the reflective coating 150 and 151 to facilitate accurate measurements of the pyrometers 140.

The thermal processing chamber system 110 includes one or more distance sensors 160 mounted to the one or more sidewalls 103 between the upper wall 121 and the lower wall 153. The one or more distance sensors 160 are directed horizontally (e.g., radially inward) toward the edge ring 114.

Figure 1B:
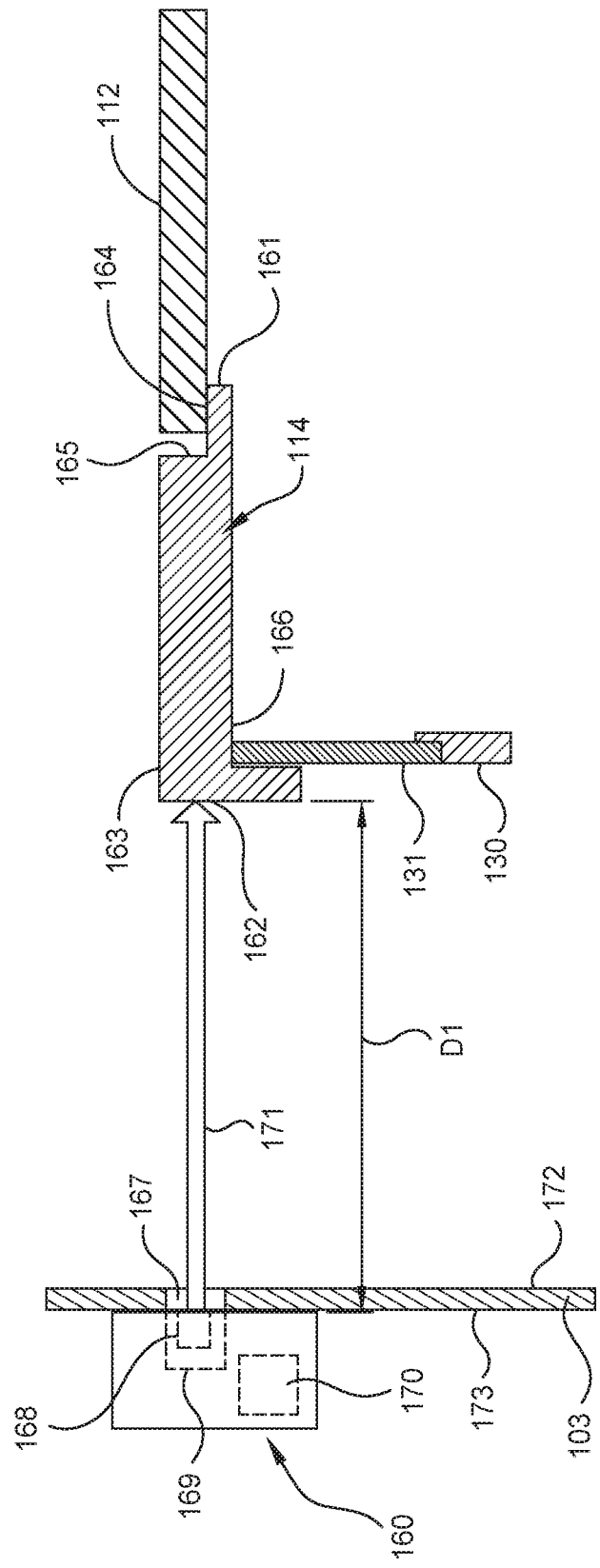
FIG. 1B is an enlarged partial schematic cross-sectional view of the thermal processing chamber illustrated in FIG. 1A, according to one implementation.

FIG. 1B is an enlarged partial schematic cross-sectional view of the thermal processing chamber 100 illustrated in FIG. 1A, according to one implementation. The edge ring 114 includes an inner surface 161, a recessed inner surface 165 formed in the inner surface 161, an outer surface 162 facing the one or more sidewalls 103, an upper surface 163, a recessed upper surface 164 formed in the upper surface 163, and a lower surface 166. The one or more distance sensors 160 mounted to the one or more sidewalls 103 are directed toward the outer surface 162 of the edge ring 114 to measure a distance D1 between the outer surface 162 and the respective distance sensor 160. In one embodiment, which can be combined with other embodiments, the distance D1 is a horizontal distance. Each distance sensor 160 includes a signal emitter 168, a signal receiver 169. In one embodiment, which can be combined with other embodiments, each distance sensor 160 includes an onboard controller 170, such as an onboard processor. The signal emitter 168 is directed to emit one or more signals 171 toward the outer surface 162 of the edge ring 114 at a signal speed. The signal receiver 169 is configured to recognize and receive the one or more signals 171 that are reflected off of the outer surface 162 and back toward the respective distance sensor 160 as one or more reflected signals. The onboard controller 170 determines the distance D1 using the reflected signals, an operational time, and the signal speed. In one embodiment, which can be combined with other embodiments, the distance sensors 160 include laser distance sensors where the signal emitter 168 is a laser emitter and the signal receiver 169 is a laser receiver, such as an optical lens. In such an embodiment, the signals 171 include laser light. In one example, which can be combined with other examples, the laser light includes beams having a beam diameter of 0.5 mm or greater, such as 1.0 mm or grater. In one example, which can be combined with other examples, the laser light includes visible light. In one example, which can be combined with other examples, the laser light includes a wavelength that is within a range of 400 nm to 700 nm, such as within a range of 640 nm to 670 nm.

The one or more sidewalls 103 include one or more window portions 167 (such as one or more view ports). The one or more distance sensors 160 are mounted adjacent to the window portions 167 of the one or more sidewalls 103. The one or more distance sensors 160 emit the signals 171 through the respective window portion 167 of the respective sidewall 103. The window portion 167 is transparent relative to the signals 171 such that the signals 171 propagate through the window portion 167. The window portion 167 may include quartz. The present disclosure contemplates that the respective window portion 167 may form part of, or an entirety of, the respective sidewall 103. Each of the one or more sidewalls 103 includes an inner surface 172 and an outer surface 173. The one or more distance sensors 160 are mounted to the outer surface 173 of the respective sidewall 103.

Referring to FIG. 1A, the thermal processing chamber system 110 includes a controller 180 to control aspects of the thermal processing chamber 100 during thermal processing. The controller 180 includes a processor 181, such as a central processing unit (CPU), a memory 182, and a support circuit 183 for the processor 181. The controller 180 may be one of any form of general-purpose computers that can be used in an industrial setting for controlling various chamber components and sub-processors. The memory 182 stores software (source or object code), such as a computer program, that may be executed or invoked to control the overall operations of the thermal processing chamber 100 in manners described herein. The controller 180 manipulates respective operations of controllable components in the thermal processing chamber 100. For example, the controller 180 is in communication with, and controls, the operations of the pyrometers 140, the one or more distance sensors 160, the plurality of heat lamps 126, the drive ring 132 (or a motor driving the drive ring 132), and the lift pins 122. The controller 180 is in communication with, and controls, the robot used to extend through the valve or access port 113 to transfer the substrate 112 in and out of the processing volume 118.

The controller 180 may receive the outputs of the pyrometers 140 and accordingly control the voltages supplied to the different rings of the heat lamps 126 to thereby dynamically control the radiant heating intensity and pattern during the thermal processing. The pyrometry can be improved by further including an emissometer or reflectometer to optically probe the substrate 112 to measure the emissivity or reflectance of the portion of the substrate 112 the pyrometer is facing in the relevant wavelength range and the control algorithm within the controller 180 to include the measured emissivity.

The controller 180 includes a non-transitory computer-readable medium (such as the memory 182) including instructions (such as the software) that when executed (such as by the processor 181) causes one or more of the operations described herein to be conducted. In one embodiment, which can be combined other embodiments, the instructions of the non-transitory computer-readable medium of the controller 180, when executed, cause one or more operations of the method 500 to be conducted. In one example, which can be combined with other examples, the instructions cause one or more of operations 501, 503, 505, 507, 509, 511, 513, 515, and/or 517 to be conducted in relation to the thermal processing chamber 100 and the aspects and components thereof.

Figure 2:
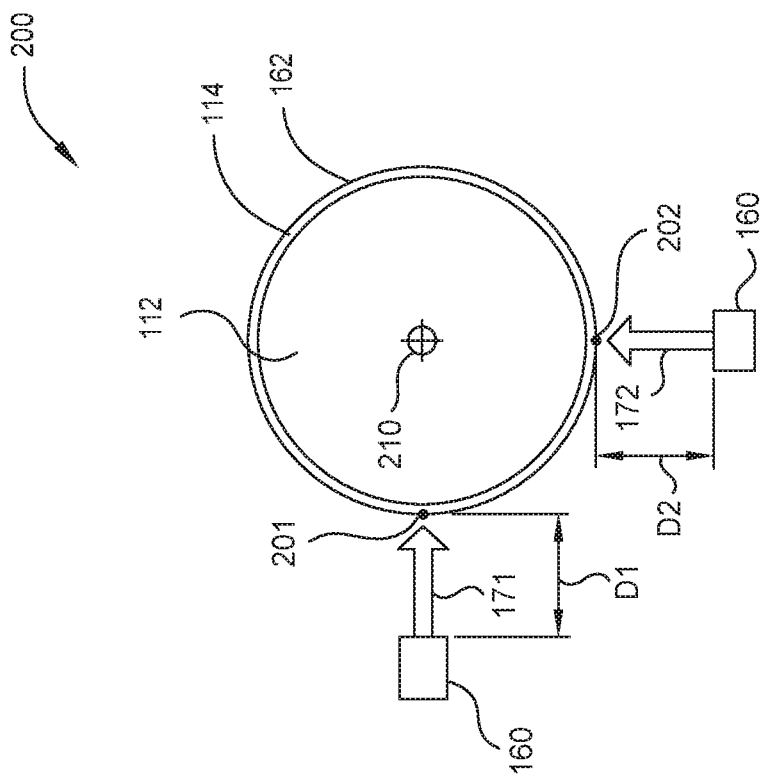
FIG. 2 illustrates a schematic top partial view of a thermal processing chamber system, according to one implementation.

FIG. 2 illustrates a schematic top partial view of a thermal processing chamber system 200, according to one implementation. The thermal processing chamber system 200 may include one or more aspects, features, components, and/or properties of the thermal processing chamber system 110 described above. The thermal processing chamber system 200 includes a plurality of distance sensors 160 (two are shown) mounted about the edge ring 114. The distance sensors 160 are mounted at a plurality of angular positions relative to the edge ring 114. The distance sensors 160 are disposed approximately 90 degrees angularly apart. In one embodiment, which can be combined with other embodiments, the plurality of distance sensors 160 are disposed at least 45 degrees angularly apart relative to the edge ring 114. In the implementations shown in FIG. 2, the edge ring 114 may or may not rotate relative to the distance sensors 160. The plurality of distance sensors 160 simultaneously emit signals 171 toward the outer surface 162 of the edge ring 114. The distance sensors 160 simultaneously measure a first distance D1 and a second distance D2, respectively, between the outer surface 162 of the edge ring 114 and the respective distance sensor 160 at a plurality of angular positions 201, 202 of the edge ring 114 that correspond to the plurality of angular positions of the distance sensors 160.

The first distance D1 and the second distance D2 measured by the distance sensors 160 are used to determine a center position shift in a center position 210 of the edge ring 114. In one embodiment, which can be combined with other embodiments, differences in the measured first distance D1 and differences in the measured second distance D2 are used to determine the center position shift. In one example, which can be combined with other examples, phase differences of the measured first distance D1 and the measured second distance D2 are used to determine the center position shift. In one embodiment, which can be combined with other embodiments, the first distance D1 and the second distance D2 are measured across one or more full rotations of the edge ring 114, and a plurality of distance values are measured for each of the first distance D1 and the second distance D2. The determining the center positon shift includes averaging the plurality of distance values for each of the first distance D1 and the second distance D2 across the one or more full rotations of the edge ring 114.

Figure 3:
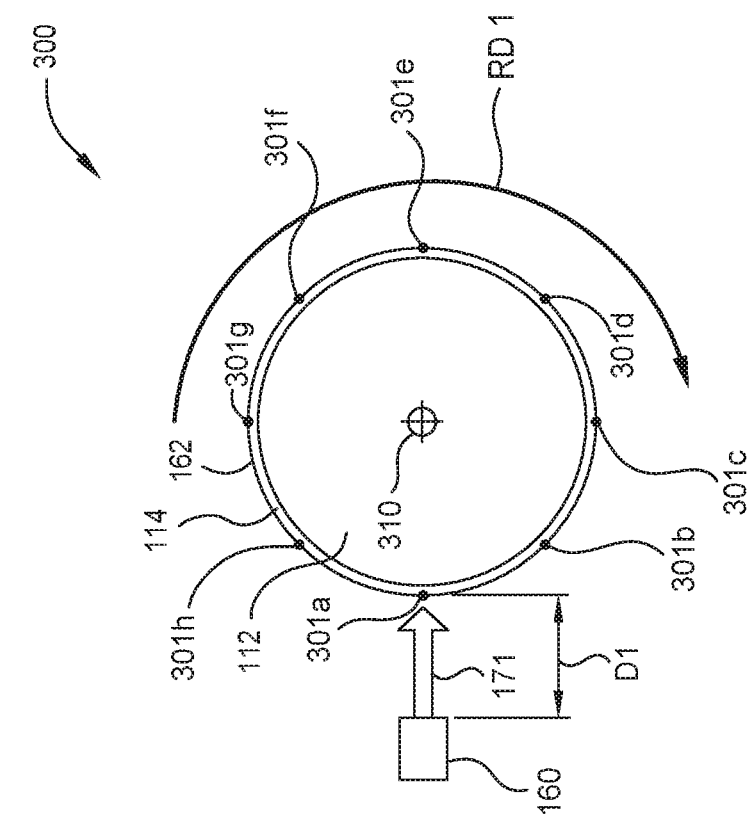
FIG. 3 illustrates a schematic partial top view of a thermal processing chamber system, according to one implementation.

FIG. 3 illustrates a schematic partial top view of a thermal processing chamber system 300, according to one implementation. The thermal processing chamber system 300 may include one or more aspects, features, components, and/or properties of the thermal processing chamber system 110 described above. The thermal processing chamber system 300 includes a single distance sensor 160 mounted to a respective sidewall 103 and directed toward the outer surface 162 of the edge ring 114. The edge ring 114 and the substrate 112 are rotated in a rotational direction RD1 using the rotor 130. While the edge ring 114 and the substrate 112 rotate, the single distance sensor 160 emits the signals 171 and measures the distance D1. In one example, which may be combined with other examples, the single distance sensor 160 measures the distance D1 along a plurality of angular positions 301a-301h of the edge ring 114, such as across at least a 180 degree rotation of the edge ring 114, for example at least a 360 degree rotation of the edge ring 114. Measuring the distance D1 along the plurality of angular positions 301a-301h results in a plurality of distance values, using the single distance sensor 160, that correspond to the angular positions 301a-301h. In one embodiment, which can be combined with other embodiments, the single distance sensor 160 measures a plurality of distance values along the entire circumference of the outer surface 162 of the edge ring 114.

The distance values measured by the single distance sensor 160 are used to determine a center position shift in a center position 310 of the edge ring 114. In one embodiment, which can be combined with other embodiments, the plurality of distance values are measured across an angle of rotation to result in oscillations of measure distance values. The center position shift is determined using a maximum amplitude of the oscillations and a phase of the oscillations relative to the angle of rotation.

Figure 4:
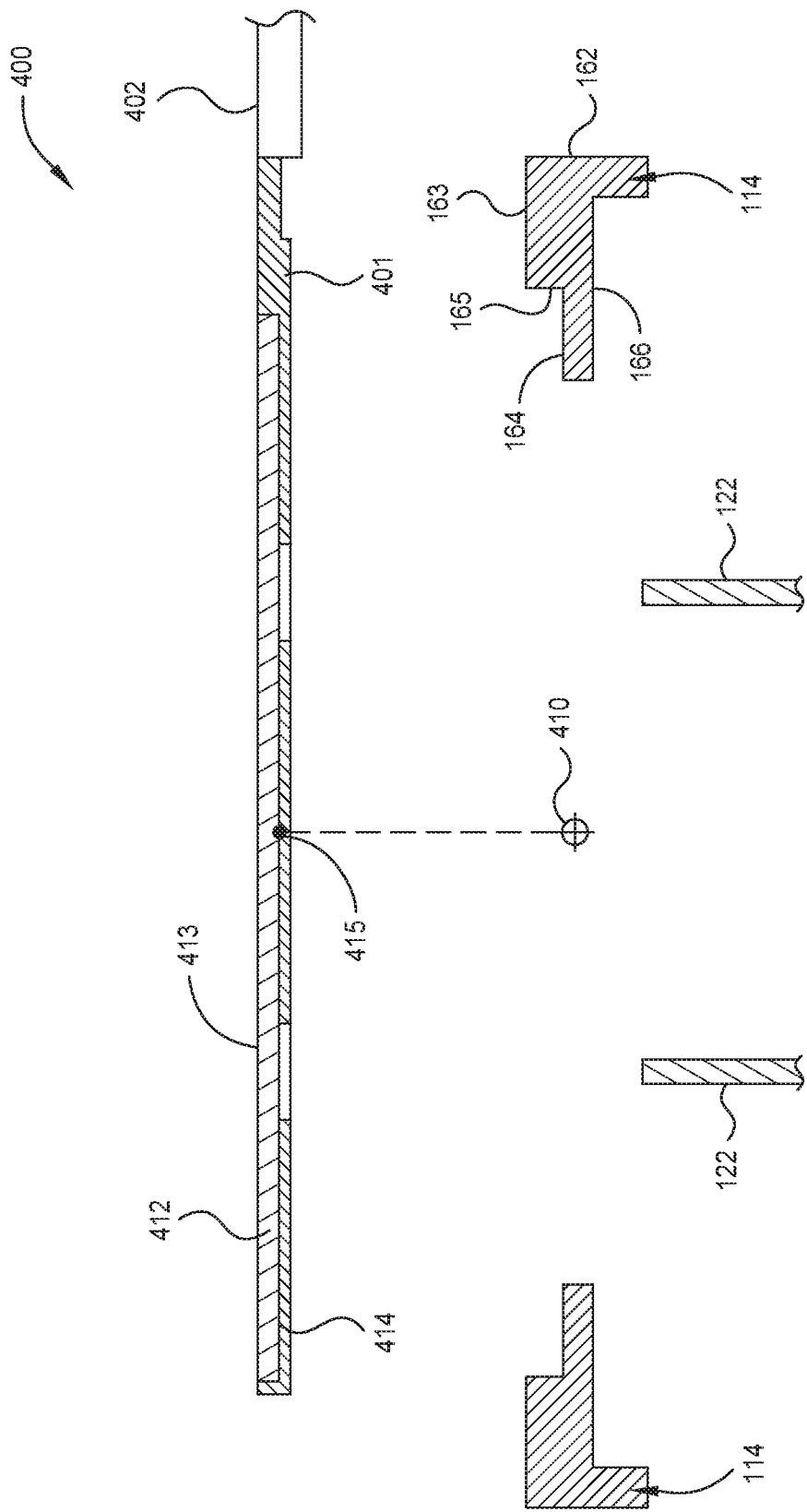
FIG. 4 illustrates a schematic partial side view of a robot apparatus used in conjunction with the thermal processing chamber illustrated in FIGS. 1A and 1B, according to one implementation.

FIG. 4 illustrates a schematic partial side view of a robot apparatus 400 used in conjunction with the thermal processing chamber 100 illustrated in FIGS. 1A and 1B, according to one implementation. The robot apparatus 400 includes a robot blade 401 and a robot arm 402 coupled to the robot blade 401. A second substrate 412 is supported on and transported using the robot blade 401. The robot blade 401 and the robot arm 402 extend through the valve or access port 113 to transfer the second substrate 412 into the processing volume 118. The robot apparatus 400 is instructed to horizontally align the second substrate 412 with a corrected landing position 410 determined using the center position shift in the center position of the edge ring 114. The center position shift of the edge ring 114 is determined using one or more distances measured by the one or more distance sensors 160 during processing of the substrate 112. The second substrate 412 includes a top surface 413 and a bottom surface 414. In one embodiment, which can be combined with other embodiments, the robot apparatus 400 is instructed to horizontally align a center 415 of the bottom surface 414 with the corrected landing position 410.

After the second substrate 412 is aligned with the corrected landing position 410, the lift pins 122 raise to lift the second substrate 412 off of the robot blade 401. The robot blade 401 includes one or more openings, and the lift pins 122 move through the openings to engage the bottom surface 414 and lift the second substrate 412. The robot blade 401 and the robot arm 403 move out from under the second substrate 412, through the valve or access port 113 (shown in FIG. 1), and out of the processing volume 118 (shown in FIG. 1). While supported on the lift pins 122 and in a raised position, the second substrate 412 is pre-heated using the heat lamps 126, and thermally stabilized. During the pre-heating, the center 415 of the second substrate 412 is aligned with the corrected landing position 410 for the edge ring 114. The lift pins 122 lower to land the second substrate 412 on the recessed upper surface 164 of the edge ring 114. The recessed upper surface 164 may include the annular sloping shelf 115 described in relation to FIG. 1A. While supported on the edge ring 114 in a lowered position, the second substrate 412 is annealed using the heat lamps 126. During the annealing, the center 415 of second substrate 412 is aligned with the corrected landing position 410 of the edge ring 114.

Figure 5:
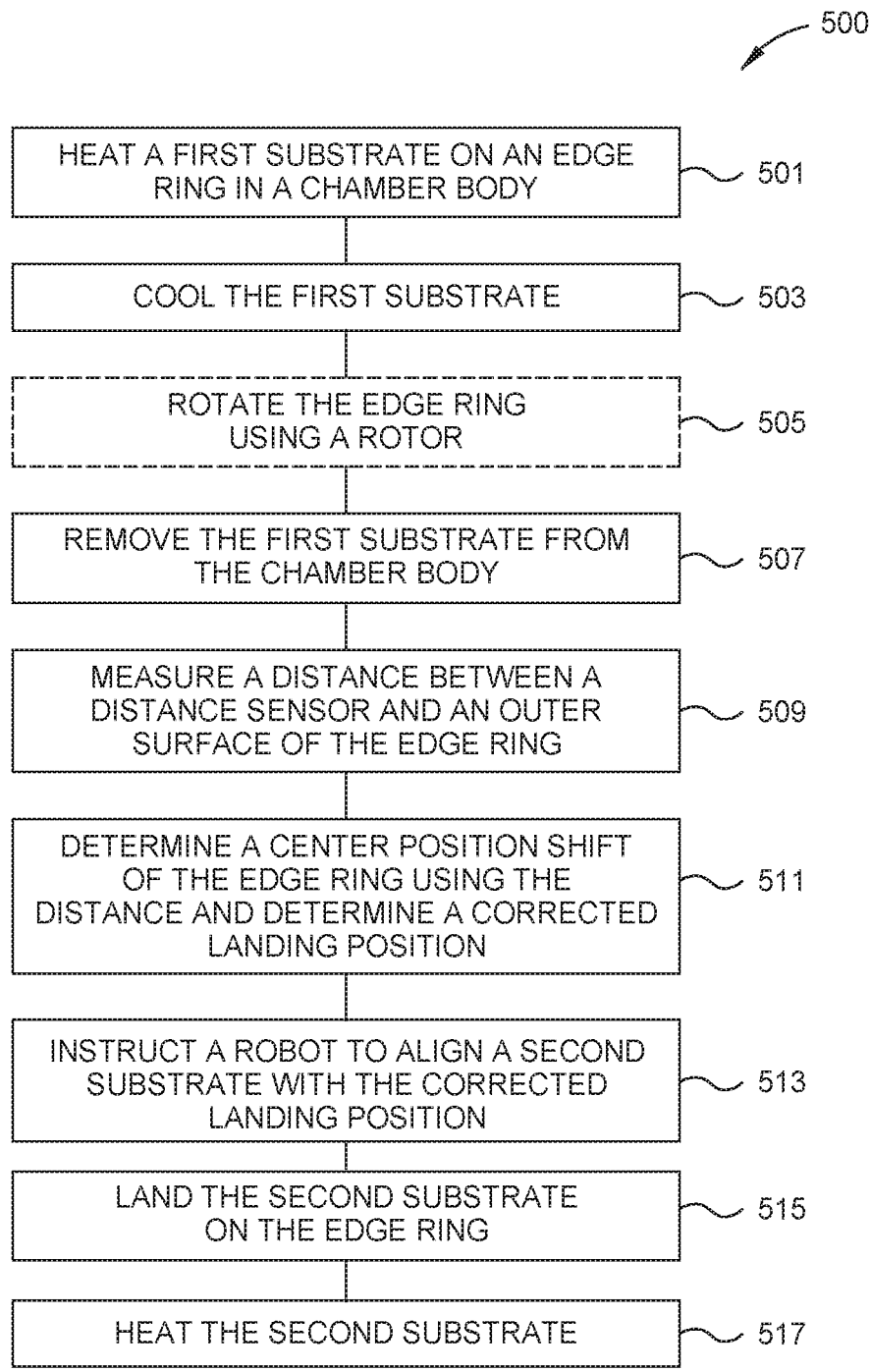
FIG. 5 illustrates a schematic illustration of a method of operating a thermal processing chamber, according to one implementation.

FIG. 5 illustrates a schematic partial illustration of a method 500 of operating a thermal processing chamber, according to one implementation. The present disclosure contemplates that one or more aspects, features, components, and/or properties of the method may be combined with and/or used in conjunction with one or more aspects, features, components, and/or properties of the thermal processing chamber system 110, thermal processing chamber 100, thermal processing chamber system 200, thermal processing chamber system 300, and/or robot apparatus 400 described in relation to FIGS. 1A, 1B, 2, 3, and 4 above.

At operation 501, the method 500 includes heating a first substrate disposed on an edge ring in a chamber body. The first substrate is supported on the edge ring. The edge ring and the first substrate are disposed in a processing volume of the chamber body. The first substrate is heated to a first temperature using a plurality of heat lamps. The heating at operation 501 includes heating the first substrate to a first temperature. In one embodiment, which can be combined with other embodiments, the heating the first substrate to the first temperature includes annealing the first substrate to a peak anneal temperature. In one example, the peak anneal temperature is greater than 900 degrees Celsius, such as within a range of 1000 degrees Celsius to 1100 degrees Celsius. The heating at operation 501 includes pre-heating the first substrate to a pre-heat temperature and thermally stabilizing the first substrate to a stabilization temperature prior to annealing the first substrate to the peak anneal temperature. In one example, the pre-heat temperature is within a range of 180 degrees Celsius to 220 degrees Celsius, such as 200 degrees Celsius. In one example, the stabilization temperature is within a range of 480 degrees Celsius to 520 degrees Celsius, such as 500 degrees Celsius. In one example, the first substrate is raised above the edge ring on lift pins during the pre-heating and the stabilizing, and the first substrate is lowered to the edge ring to be supported on the edge ring during the heating of the first substrate to the first temperature. The first substrate is loaded into the chamber body and onto the lift pins using a robot.

In one embodiment, which can be combined with other embodiments, the first substrate is heated to the first temperature at a heat rate of 10 degrees Celsius per second or greater, such as 50 degrees Celsius per second or 75 degrees Celsius per second. In one embodiment, which can be combined with other embodiments, the first substrate is heated to the first temperature at a heat rate that is within a range of 10 degrees Celsius per second to 250 degrees Celsius per second.

At operation 503, the first substrate is cooled to a second temperature that is lesser than the first temperature. The second temperature is selected to facilitate using the robot to remove the first substrate from the processing volume of the chamber body of the thermal processing chamber. In one embodiment, which can be combined with other embodiments, the second temperature is within a range of 380 degrees Celsius to 420 degrees Celsius, such as 400 degrees Celsius.

At optional operation 505, the edge ring is rotated using a rotor, and the edge ring is supported on the rotor. The edge ring, and the first substrate disposed on the edge ring, is rotated during one or more of the heating of the substrate to the first temperature (at operation 501) and/or the cooling of the first substrate to the second temperature (at operation 505).

At operation 507, the robot is used to remove the first substrate from the processing volume and from the chamber body of the thermal processing chamber. The removal includes raising lift pins to raise the first substrate off of the edge ring, moving a robot blade of the robot blade under the first substrate, lowering the lift pins to land the first substrate on the robot blade, and moving the robot blade out of the processing volume and out of the chamber body of the thermal processing chamber. The present disclosure contemplates that the distance may be measured (at operation 509) and the center position shift may be determined (at operation 511) after the removal of the first substrate from the processing volume and/or during the removal of the first substrate. In one embodiment, which can be combined with other embodiments, the edge ring is rotated upon the first substrate being raised off of the edge ring, and the distance is measured while the edge ring is rotated during removal of the first substrate. In one embodiment, which can be combined with other embodiments, the edge ring is rotated upon the first substrate being removed from the processing volume, and the distance is measured while the edge ring is rotated after removal of the first substrate.

At operation 509, a distance is measured between one or more distance sensors and an outer surface of the edge ring. The one or more distance sensors are used to measure the distance. The one or more distance sensors may measure the distance before or after the heating at operation 501, during the heating at operation 501, before or after the cooling at operation 503, and/or during the cooling at operation 503. In one embodiment, which can be combined with other embodiments, the one or more distance sensors measure the distance after the heating of the first substrate to the first temperature (at operation 501) and the cooling of the first substrate to the second temperature (at operation 503). In one embodiment, which can be combined with other embodiments, the distance is measured after the heating at operation 501, after the cooling at operation 503, and after or during the removing of the first substrate described in relation to operation 507.

In one embodiment, which can be combined with other embodiments, the distance is measured before loading a second substrate into the chamber body using the robot.

In one embodiment, which can be combined with other embodiments, the one or more distance sensors measure the distance during rotation of the edge ring (at operation 505). In one example, which may be combined with other examples, the one or more distance sensors measure the distance along a plurality of angular positions of the edge ring, such as across at least a 180 degree rotation of the edge ring, for example at least a 360 degree rotation of the edge ring. In one example, which may be combined with other examples, a single distance sensor is used to measure the distance while the edge ring rotates, and the single distance sensor measures the distance along at least a 180 degree rotation of the edge ring, such as at least a 360 degree rotation of the edge ring.

In one embodiment, which can be combined with other embodiments, the distance is measured after the heating at operation 501, after the cooling at operation 503, and as the robot enters the thermal processing chamber to land the second substrate on the edge ring, as described in relation to operation 515. In such an embodiment, the distance is measured after the first substrate is removed at operation 507. In such an embodiment, the distance is measured while the second substrate is supported on a robot blade prior to the second substrate being transferred from the robot blade to lift pins and prior to the lift pins landing the second substrate on the edge ring. Aspects of such embodiments facilitate accurate placement of the second substrate relative to the edge ring if the edge ring is not movable translationally in a horizontal direction.

In one embodiment, which can be combined with other embodiments, the distance is measured after the second substrate is transferred from the robot blade to the lift pins and/or while the lift pins lower to land the second substrate on the edge ring. In such an embodiment, the distance is measured while the second substrate is supported on the lift pins and prior to the second substrate landing on the edge ring.

In one embodiment, which can be combined with other embodiments, the one or more distance sensors include a plurality of distance sensors disposed about the edge ring at a plurality of angular positions relative to the edge ring. The plurality of distance sensors simultaneously measure the distance between the outer surface of the edge ring and the respective distance sensor at a plurality of angular positions of the edge ring that correspond to the plurality of angular positions of the distance sensors.

Measuring the distance along the plurality of angular positions results in a plurality of distance values, using the one or more distance sensors, that correspond to the angular positions.

The measuring the distance using each distance sensor of the one or more distance sensors at operation 509 includes emitting one or more signals from the respective distance sensor and toward the outer surface of the edge ring. The measuring using each distance sensor includes receiving at the respective distance sensor one or more reflected signals that reflect off the outer surface of the edge ring, and determining the distance between the outer surface of the edger ring and the respective distance sensor using the one or more reflected signals. In one embodiment, which can be combined with other embodiments, the distance is determined using a signal speed and an operation time. In one example, which may be combined with other examples, the signal speed is the speed at which the one or more signals are emitted, and the operation time is a measured time at which it takes the one or more emitted signals to reach the outer surface, reflect off the outer surface, and be received at the respective distance sensor. In one example, which can be combined with other examples, the operation time is the time elapsing between emission of the one or more signals from the respective distance sensor and receipt of the one or more reflected signals at the respective distance sensor.

In one embodiment, which can be combined with other embodiments, each of the one or more distance sensors include a laser emitter, and the one or more signals emitted by each respective distance sensor includes laser light emitted by the laser emitters. In one embodiment, which can be combined with other embodiments, the one or more reflected signals include reflected laser light, and the signal speed is a laser light speed.

Using the signal speed and the operation time, the distance between the respective distance sensor and the outer surface of the edge ring is calculated and measured. The present disclosure contemplates that the distance may be calculated by a controller and/or processor onboard each respective distance sensor, and that the distance may be calculated by a controller and/or processor with which the respective distance sensor is in communication.

At operation 511, the distance between the respective distance sensors and the outer surface of the edge ring is used to determine a center position shift of the edge ring. The center position shift relates to a shift of a geometric center of the edge ring in a horizontal plane. The center position shift is determined using a controller that is in communication with the one or more distance sensors. In one embodiment, which can be combined with other embodiments, the center position shift of the edge ring includes a first horizontal shift along an X-axis, and a second horizontal shift along a Y-axis. The X-axis and the Y-axis extend along a horizontal plane that extends through the edge ring. Also at operation 511, a corrected landing position for a robot is determined using the center position shift that is determined. In one embodiment, which can be combined with other embodiments, the corrected landing position for the robot includes a first horizontal corrected position along the X-axis, and a second horizontal corrected position along the Y-axis.

At operation 513, a robot is instructed to align a second substrate with a corrected landing position that is determined at operation 511. The robot may be instructed using the same controller that determines the center position shift of the edge ring and/or the corrected landing position for the robot. In one embodiment, which can be combined with other embodiments, a center of a bottom surface of the second substrate is aligned within an offset of 0.1 mm or less relative to the corrected landing position. In such an embodiment, the center of the bottom surface of the second substrate is aligned to be at a distance of 0.1 mm or less from the corrected landing position. The robot aligns the second substrate with the corrected landing positon. In one embodiment, which can be combined with other embodiments, the robot aligns the second substrate with the corrected landing position, and the lift pins raise to lift the second substrate off of a robot blade of the robot while the second substrate is aligned with the corrected landing position. In one embodiment, which can be combined with other embodiments, at operation 513 a landing location is specified for the robot that corresponds to the corrected landing position determined at operation 511. In one embodiment, which can be combined with other embodiments, at operation 513 a landing location for the robot is pre-selected, and the corrected landing position determined at operation 511 is used to correct the landing location to a corrected landing location that corresponds to the corrected landing position.

The present disclosure contemplates that, at operation 513, in embodiments where the edge ring is translationally movable in one or more horizontal directions, the robot and/or the edge may be instructed to move or align the second substrate with the corrected landing position. In one embodiment, which can be combined with other embodiments, the edge ring is movable translationally in one or more horizontal directions and translationally in one or more vertical directions using the support cylinder and the rotor on which the edge ring is supported. The rotor is magnetically levitated and magnetically moved.

At operation 515, the second substrate is landed onto the edge ring. The second substrate is supported on the lift pins while aligned with the corrected landing position, and the lift pins lower until the bottom surface of the second substrate engages the edge ring to land the second substrate on the edge ring. The second substrate is supported on the edge ring and is aligned with the corrected landing position.

At operation 517, the second substrate is heated to a first temperature, such as annealed to a peak anneal temperature. The second substrate is aligned with the corrected landing position of the edge ring while the second substrate is heated at operation 517. The heating at operation 517 includes one or more of the aspects, features, components and/or properties described in relation to the heating of the first substrate at operation 501.

Figure 6:
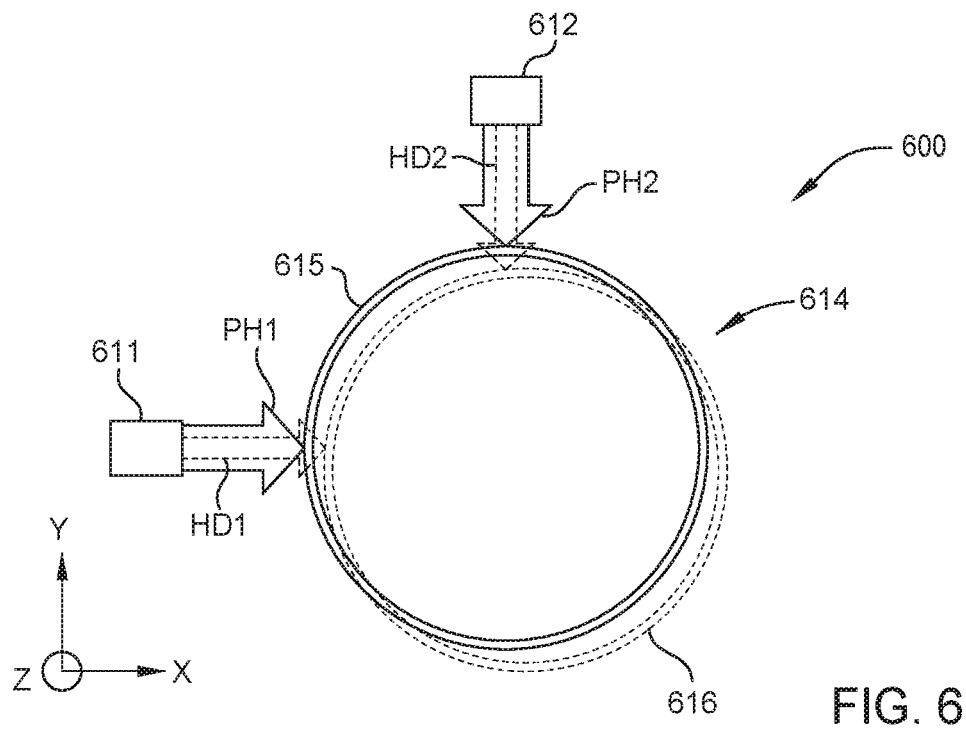
FIG. 6 illustrates a schematic top partial view of a thermal processing chamber system, according to one implementation.

FIG. 6 illustrates a schematic top partial view of a thermal processing chamber system 600, according to one implementation. Two distance sensors 611, 612 are disposed angularly 90 degrees apart about an edge ring 614. A predetermined position 615 for the edge ring 614 is shown. After thermal processing the edge ring 614 shifts from the predetermined position 615 to a shifted position 616. The predetermined position 615 for edge ring 614 corresponds to a geometric center of a rotor (such as the rotor 130) that is used to support and rotate the edge ring 614. During annealing of substrates, the edge ring 614 moves relative to the rotor and a center position of the edge ring 614 shifts from the predetermined position 615 to the shifted position 616.

The first distance sensor 611 is aligned along the X-axis and measures a first horizontal distance HD1 between the first distance sensor 611 and an outer surface of the edge ring 614 after the edge ring has shifted to the shifted position 616. A first horizontal shift HS1 along the X-axis is determined by subtracting a predetermined first horizontal distance PH1 from the first horizontal distance HD1. The predetermined first horizontal distance PH1 is the measured horizontal distance between the first distance sensor 611 and the outer surface of the edge ring 614 while the edge ring is in the predetermined position 615.

The second distance sensor 612 is aligned along the Y-axis and measures a second horizontal distance HD2 between the second distance sensor 612 and the outer surface of the edge ring 614 after the edge ring has shifted to the shifted position 616. A second horizontal shift HS2 along the Y-axis is determined by subtracting the second horizontal distance HD2 from a predetermined second horizontal distance PH2. The predetermined second horizontal distance PH2 is the measured horizontal distance between the second distance sensor 612 and the outer surface of the edge ring 614 while the edge ring 614 is in the predetermined position 615.

A corrected landing position for a robot in relation to the center position shift of the edge ring 614 is determined using the first horizontal shift HS1 and the second horizontal shift HS2. A first horizontal corrected position along the X-axis is determined by adding the first horizontal shift HS1 to a first predetermined landing position PL1 of the robot along the X-axis used when the edge ring 614 was in the predetermined position 615. A second horizontal corrected position along the Y-axis is determined by adding the second horizontal shift HS2 to a second predetermined landing position PL2 of the robot along the Y-axis used when the edge ring 614 was in the predetermined position 615. The robot is used to adjust the landing position of subsequently-processed substrates to the corrected landing position that includes the first horizontal corrected position and the second horizontal corrected position.

Figure 7:
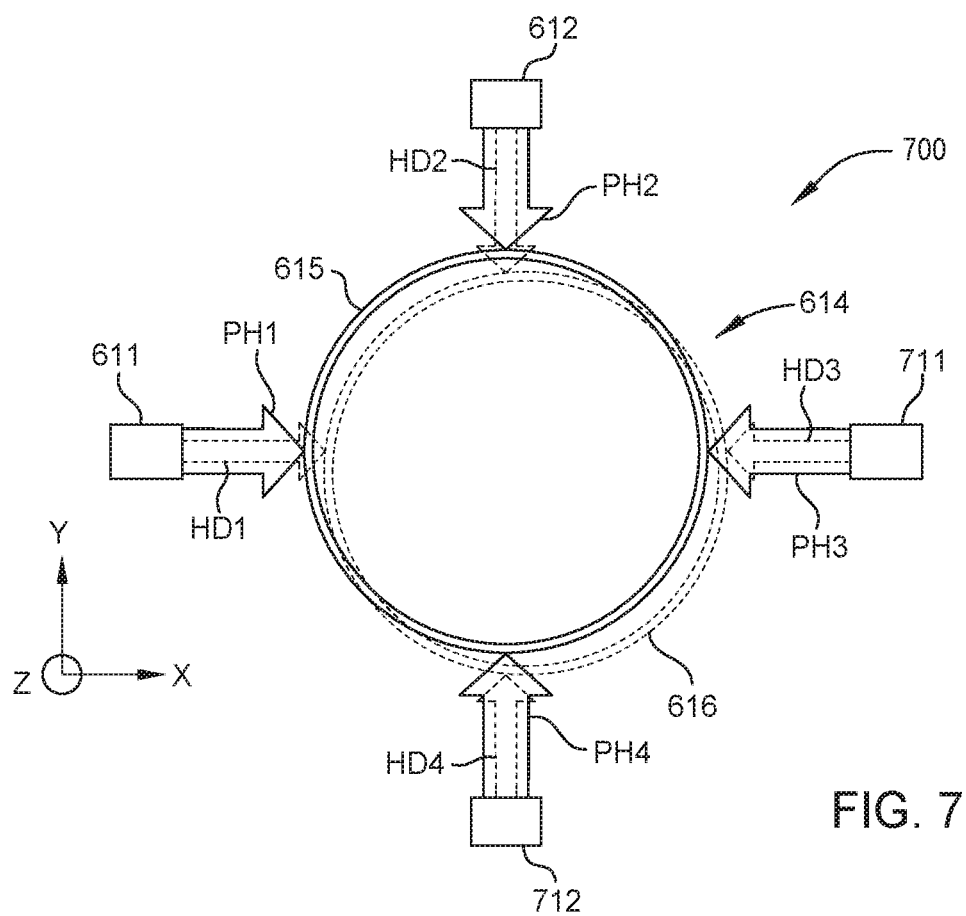
FIG. 7 illustrates a schematic top partial view of a thermal processing chamber system, according to one implementation.

FIG. 7 illustrates a schematic top partial view of a thermal processing chamber system 700, according to one implementation. The thermal processing chamber system 700 is similar to the thermal processing chamber system 600 illustrated in FIG. 6, and includes one or more of the aspects thereof. Four distance sensors 611, 612 and 711, 712 are disposed angularly 90 degrees apart about the edge ring 614. After thermal processing the edge ring 614 shifts from the predetermined position 615 to the shifted position 616.

A third distance sensor 711 is aligned along the X-axis and measures a third horizontal distance HD3 between the third distance sensor 711 and the outer surface of the edge ring 614 after the edge ring has shifted to the shifted position 616. A third horizontal shift HS3 along the X-axis is determined by subtracting a predetermined third horizontal distance PH3 from the third horizontal distance HD3. The predetermined third horizontal distance PH3 is the measured horizontal distance between the third distance sensor 711 and the outer surface of the edge ring 614 while the edge ring 614 is in the predetermined position 615.

A fourth distance sensor 712 is aligned along the Y-axis and measures a fourth horizontal distance HD4 between the fourth distance sensor 712 and the outer surface of the edge ring 614 after the edge ring 614 has shifted to the shifted position 616. A fourth horizontal shift HS4 along the Y-axis is determined by subtracting the fourth horizontal distance HD4 from a predetermined second horizontal distance PH4. The predetermined fourth horizontal distance PH4 is the measured horizontal distance between the fourth distance sensor 712 and the outer surface of the edge ring 614 while the edge ring 614 is in the predetermined position 615.

A corrected landing position for a robot in relation to the center position shift of the edge ring 614 is determined. The corrected landing position may be determined using the first horizontal shift HS1, the second horizontal shift HS2, the third horizontal shift HS3, and the fourth horizontal shift HS4.

A first horizontal corrected position along the X-axis is determined by adding a first horizontal correction C1 to the first predetermined landing position PL1 of the robot along the X-axis used when the edge ring 614 was in the predetermined position 615. The first horizontal correction C1 along the X-axis is determined using Equation 1 shown below:

$$C1=0.5\times((PH3-HD3)-(PH1-HD1)) \quad \text{(Equation 1)}$$

A second horizontal corrected position along the Y-axis is determined by adding a second horizontal correction C2 to the second predetermined landing position PL2 of the robot along the Y-axis used when the edge ring 614 was in the predetermined position 615. The second horizontal correction C2 along the Y-axis is determined using Equation 2 shown below:

$$C2=0.5\times((PH2-HD2)-(PH4-HD4)) \quad \text{(Equation 2)}$$

The robot is used to adjust the landing position of subsequently-processed substrates to the corrected landing position that includes the first horizontal corrected position and the second horizontal corrected position.

Measuring the distance between the outer surface 162 of the edge ring 114 and the one or more distance sensors 160 facilitates simply, quickly, accurately, and effectively determining shifts in a center position of the edge ring 114 resulting from thermal expansions and/or thermal contractions. Accounting for changes in the center position of the edge ring 114, and aligning substrates with the changed center position during thermal processing facilitates temperature uniformity along the substrates, such as adjacent the edges of the substrates. Temperature uniformity facilitates feature uniformity to facilitate increased throughput, lower costs, and increased operational efficiency.

The present disclosure contemplates that measuring a change in the center position of the edge ring 114, and aligning the substrates with the changed center position of the edge ring 114 using the corrected landing position more effectively, accurately, and quickly promotes uniformity relative to implementations that only change other operational parameters and/or measure only other operational parameters.

Aspects disclosed herein also facilitate accurately and simply accounting for shifts in edge ring 114 center positions that are 0.1 mm are smaller. As an example, using the single distance sensor 160 and the rotation of the edge ring 114 facilitates accurate measurements with a measurement system that is easy to implement and use. The measurements can also be taken in real-time, and the substrate landing adjustments can be made in real-time, facilitating quick measurements and reduced machine downtime to make adjustments.

Measuring the distance between a distance sensor 160 mounted on a sidewall and the outer surface 162 of the edge ring 114 also reduces or eliminates interference of the heat light from the heat lamps 126 with the signals 171 emitted by the distance sensors 160, facilitating accurate and effective measurements. Aspects disclosed herein also facilitate modularity in application with systems. As an example, the aspects disclosed herein may be used to account for changes in a center position for edge rings in systems where the edge cannot be moved translationally in a vertical direction and/or a horizontal direction.

Benefits of the present disclosure include using modularity in application with systems; effectively, quickly, and accurately measuring changes in a center position of an edge ring in real-time; accurately measuring changes in a center position of an edge ring that are 0.1 mm or less; effectively, quickly, and accurately adapting substrates to changes in a center position of an edge ring in real-time; temperature uniformity of substrates; feature uniformity of substrates; increased throughput; increased efficiencies; and reduced machine downtime.

Aspects of the present disclosure include one or more distance sensors 160 directed toward the outer surface 162; determining a center position shift of an edge ring 114 using distance measurements; determining a corrected landing position for the edge ring 114 using the center position shift; instructing a robot to align substrates with the corrected landing position for the edge ring 114; thermal processing chamber 100; controller 180; thermal processing chamber system 110; thermal processing chamber system 200; thermal processing chamber system 300; robot apparatus 400, and method 500. It is contemplated that one or more aspects disclosed herein may be combined. Moreover, it is contemplated that one or more aspects disclosed herein may include some or all of the aforementioned benefits.

While the foregoing is directed to embodiments of the present disclosure, other and further embodiments of the disclosure may be devised without departing from the basic scope thereof. The present disclosure also contemplates that one or more aspects of the embodiments described herein may be substituted in for one or more of the other aspects described. The scope of the disclosure is determined by the claims that follow.

What is claimed is:

1. A thermal processing chamber apparatus, comprising:
a chamber body comprising a sidewall and a processing volume;
a rotor disposed in the processing volume of the chamber body;
an edge ring supported on the rotor, the edge ring comprising a radial inner surface and a radial outer surface, the radial outer surface facing the sidewall;
a plurality of heat lamps positioned above the edge ring and above the rotor; and
a controller including a non-transitory computer-readable medium comprising instructions that, when executed, cause the thermal processing chamber apparatus to:
heat a first substrate disposed on the edge ring to a first temperature using the plurality of heat lamps;
cool the first substrate to a second temperature that is lesser than the first temperature;
cause a first distance sensor mounted to an exterior of a sidewall of the chamber body to:
emit a first signal through a window of the sidewall towards the radial outer surface of the edge ring such that the signal reflects off the radial outer surface of the edge ring to become a first reflected signal; and
receive, through the window, the first reflected signal;
cause a second distance sensor to:
emit a second signal towards the radial outer surface of the edge ring such that the second signal reflects off the radial outer surface to become a second reflected signal; and
receive the second reflected signal;
measure a first distance between the first distance sensor and the radial outer surface of the edge ring using the first reflected signal;
measure a second distance between the second distance sensor and the radial outer surface of the edge ring using the second reflected signal;
perform repeat measurements of the first and second distances while rotating the edge ring;
determine a center position shift of the edge ring using by analyzing phase differences between the first and second distances;
determine a corrected landing position using the center position shift; and
instruct a robot to align a second substrate with the corrected landing position.

2. The thermal processing chamber apparatus of claim 1, further comprising a drive ring disposed outside of the rotor, the drive ring being magnetically coupled to the rotor to rotate the rotor.

3. The thermal processing chamber apparatus of claim 1, further comprising one or more pyrometers disposed below the edge ring, the edge ring being disposed between the one or more pyrometers and the plurality of heat lamps.

4. The thermal processing chamber apparatus of claim 1, wherein:
the first and second distance sensors each comprise a laser emitter directed to emit laser light toward the radial outer surface of the edge ring.

5. The thermal processing chamber apparatus of claim 1, wherein the center position shift comprises a first horizontal shift along an X-axis, and a second horizontal shift along a Y-axis.

6. The thermal processing chamber apparatus of claim 1 wherein the instructions, when executed, cause the rotor to rotate the edge ring while the first and second distance sensors measure the respective first and second distances along a plurality of angular positions of the edge ring.

7. A non-transitory computer-readable medium comprising instructions that, when executed, cause a thermal processing chamber system to:
heat a first substrate disposed on an edge ring in a processing volume of a chamber body to a first temperature using a plurality of heat lamps;
cool the first substrate to a second temperature that is lesser than the first temperature;
cause a first distance sensor mounted to an exterior of a sidewall of the chamber body to:
emit a first signal through a window of the sidewall towards a radial outer surface of the edge ring, the radial outer surface facing the sidewall, such that the first signal reflects off the radial outer surface to become a first reflected signal; and receive, through the window, the first reflected signal;
cause a second distance sensor to:
emit a second signal towards the radial outer surface of the edge ring such that the second signal reflects off the radial outer surface to become a second reflected signal; and
receive the second reflected signal;
measure a first distance between the first distance sensor and the radial outer surface of the edge ring using the first reflected signal;
measure a second distance between the second distance sensor and the radial outer surface of the edge ring using the second reflected signal;
perform repeat measurements of the first and second distances while rotating the edge ring;
determine a center position shift of the edge ring by analyzing phase differences between the first and second distances;
determine a corrected landing position using the center position shift; and
instruct a robot to align a second substrate with the corrected landing position.

8. The non-transitory computer-readable medium of claim 7, wherein the robot is instructed to align a center of a bottom surface of the second substrate with the corrected landing position, and the center of the bottom surface of the second substrate is aligned within an offset of 0.1 mm or less relative to the corrected landing position.

9. The non-transitory computer-readable medium of claim 8, further comprising instructions that, when executed, cause the thermal processing chamber system to land the second substrate on the edge ring.

10. The non-transitory computer-readable medium of claim 7, wherein the center position shift determined using the first and second distances comprises a first horizontal shift along an X-axis, and a second horizontal shift along a Y-axis.

11. The non-transitory computer-readable medium of claim 7, further comprising instructions that, when executed, cause a rotor to rotate the edge ring while the first and second distance sensors measure the respective first and second distances along a plurality of angular positions of the edge ring.

12. A non-transitory computer-readable medium comprising instructions that, when executed, cause a thermal processing chamber system to:
heat a first substrate disposed on an edge ring in a processing volume of a chamber body to a first temperature using a plurality of heat lamps;
cool the first substrate to a second temperature that is lesser than the first temperature;
rotate the edge ring using a rotor, the edge ring being supported on the rotor;
measure a distance between a distance sensor and a radial outer surface of the edge ring at a plurality of angular positions of the edge ring while rotating the edge ring and the first substrate thereon, wherein the radial outer surface of the edge ring faces a sidewall of the chamber body;
determine a center position shift of the edge ring using a maximum amplitude of oscillations of the distance and a phase of the oscillations of the distance relative to the angular positions of the edge ring; and
determine a corrected landing position using the center position shift.

13. The non-transitory computer-readable medium of claim 12, further comprising instructions that, when executed, cause a robot to align a center of a bottom surface of a second substrate with the corrected landing position, and the center of the bottom surface of the second substrate is aligned within an offset of 0.1 mm or less relative to the corrected landing position.

14. The non-transitory computer-readable medium of claim 13, further comprising instructions that, when executed, cause the thermal processing chamber system to land the second substrate on the edge ring.

15. The non-transitory computer-readable medium of claim 12, wherein the center position shift determined using the distance comprises a first horizontal shift along an X-axis, and a second horizontal shift along a Y-axis.

16. The non-transitory computer-readable medium of claim 12, wherein the measuring the distance between the distance sensor and the radial outer surface of the edge ring comprises:
emitting laser light from a laser emitter of the distance sensor toward the radial outer surface of the edge ring;
receiving reflected laser light that reflects off of the radial outer surface of the edge ring; and
determining the distance between the radial outer surface of the edge ring and the distance sensor using the reflected laser light.

17. The non-transitory computer-readable medium of claim 7, wherein the first signal includes laser light emitted from first a laser emitter of the first distance sensor, and the second signal includes laser light emitted from a second laser emitter of the second distance sensor.

* * * * *